United States Patent [19]

Fujiwara et al.

[11] Patent Number: 4,670,334

[45] Date of Patent: Jun. 2, 1987

[54] TRANSPARENT ELECTROCONDUCTIVE FILM

[75] Inventors: Ryoji Fujiwara, Sagamihara; Isamu Shimizu, Yokohama, both of Japan

[73] Assignee: Canon Kabushiki Kaisha, Tokyo, Japan

[21] Appl. No.: 659,850

[22] Filed: Oct. 11, 1984

[30] Foreign Application Priority Data

Oct. 15, 1983 [JP] Japan .................. 58-192720

[51] Int. Cl.⁴ ............................... B32B 7/02
[52] U.S. Cl. ........................... 428/336; 204/192.25; 204/192.29; 427/82; 427/109; 428/458; 428/461
[58] Field of Search ............. 204/242, 105 R, 192 P, 204/192 S; 427/82, 108, 109; 428/458, 461, 336

[56] References Cited

U.S. PATENT DOCUMENTS

| | | | |
|---|---|---|---|
| 3,926,751 | 12/1975 | De Nora et al. | 204/105 R |
| 4,173,518 | 11/1979 | Yamada et al. | 204/290 F |
| 4,258,984 | 3/1981 | Beni | 204/192 P |
| 4,263,112 | 4/1981 | Frosch | 204/290 F |
| 4,396,690 | 8/1983 | Gordon | 204/242 |

OTHER PUBLICATIONS

*Electro Chemical Science and Technology* "Blue Sputtered Iridium Oxide Films", pp. 766–769, Kang et al, Apr. 83.

Primary Examiner—Edith Buffalow
Attorney, Agent, or Firm—Fitzpatrick, Cella, Harper & Scinto

[57] ABSTRACT

A transparent electroconductive film is of p-type and mainly composed of iridium oxide. The p-type transparent electroconductive film can be produced by a reactive sputtering or reactive ion plating at room temperature. The p-type transparent electroconductive film can be used as electrodes.

15 Claims, 7 Drawing Figures

TRANSPARENT ELECTROCONDUCTIVE FILM

BACKGROUND OF THE INVENTION

1. Field of the Invention

This invention relates to a p-type transparent electroconductive film.

2. Description of the Prior Art

Heretofore, there have been known transparent electroconductive films such as Nesa film ($SnO_2$ thin film), ITO film (95 wt.% $In_2O_5$+5 wt.% $SnO_2$), and the like, and these films have been produced by electron beam deposition, reactive sputtering, CVD (chemical vapor deposition) or the like. Among these films, Nesa film has been long used. Nesa film is advantageously chemically stable, but has drawbacks that the electric resistance is high and the light transmittance is not so high (about 80%). These two drawbacks have been solved by ITO film (e.g. see Japanese Patent Publication No. 19125/1975). Commercially available ITO films have a transmittance of about 90% and a sheet resistance of less than several tens $\Omega/\square$.

However, these transparent electroconductive films are heated to a high temperature such as 400°–500° C. when produced, and it is not possible to produce them at low temperatures. Therefore, it is not possible to laminate a conventional transparent electroconductive film on an organic polymer such as polyester and the like.

A method for producing ITO films at low temperatures such as about 200° C. by means of a reactive high frequency ion plating method has been recently proposed, but it is still difficult to produce the transparent electroconductive films at temperatures lower than 100° C.

These transparent electroconductive films use a donor level due to oxygen vacancy and are all n-type (electron plays a main role of transferring charge). In case of photoelectro transducer and the like, if the transparent electroconductive film is formed at a p-type semiconductor side, the charge injection efficiency is disadvantageously lowered.

SUMMARY OF THE INVENTION

An object of the present invention is to provide a p-type transparent electroconductive film free from the above-mentioned drawbacks and of low electric resistance.

Another object of the present invention is to provide a process for producing, at low temperatures such as room temperature, a p-type electroconductive film which is transparent and of low electric resistance.

According to one aspect of the present invention, there is provided a p-type transparent electroconductive film comprising mainly iridium oxide.

According to another aspect of the present invention, there is provided a process for producing a p-type transparent electroconductive film which comprises effecting a reactive sputtering in oxygen gas using metallic iridium or iridium oxide as a target to form an iridium oxide film on a substrate.

According to a further aspect of the present invention, there is provided a process for producing a p-type transparent electroconductive film which comprises effecting a reactive ion plating in oxygen gas using metallic iridium or iridium oxide as an evaporation source to form an iridium oxide film on a substrate.

DESCRIPTION OF THE PREFERRED EMBODIMENTS

The p-type transparent electroconductive film of the present invention may be produced by a reactive sputtering.

Figure 1:
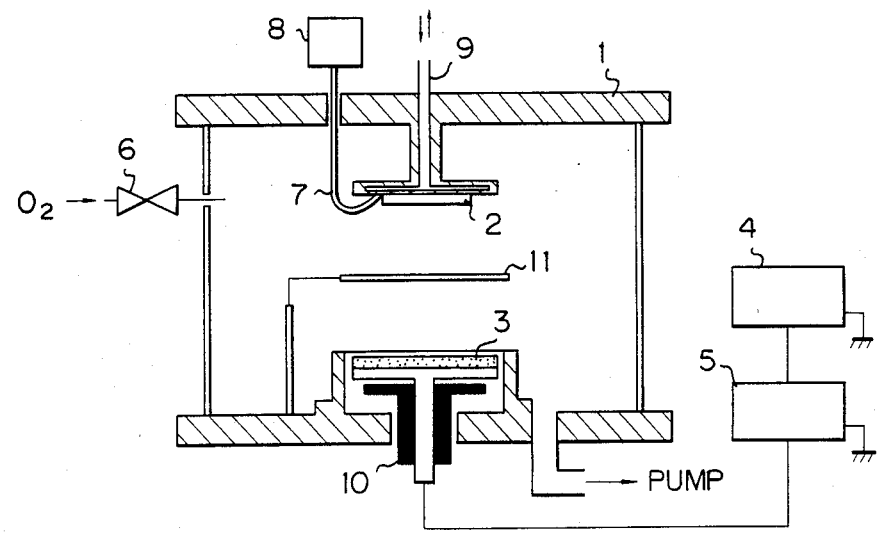
FIG. 1 shows schematically a reactive sputtering apparatus which may be used for producing a p-type transparent electroconductive film of the present invention.

FIG. 1 is an example of a sputtering apparatus used for carrying out the reactive sputtering to produce a p-type transparent electroconductive film mainly composed of iridium oxide.

In FIG. 1, 1 is a vacuum chamber, 2 a glass substrate on the surface of which a transparent electroconductive film of iridium oxide is to be formed, 3 a target composed of iridium, 4 a high frequency power source, 5 a matching box for a high frequency power source, 6 a variable leak valve for controlling the introduction of $O_2$ gas into vacuum chamber 1 and the inner pressure of vacuum chamber 1, 7 a thermocouple for detecting the temperature of substrate 2, 8 a temperature monitor for the thermocouple, 9 a copper pipe for flowing water to cool substrate 2, and 11 a shutter. In FIG. 1, the hatched portions are grounded and the black portion 10 is an insulating member supporting the target.

The pressure in vacuum chamber 1 is preferably kept at 0.01–1 Torr, and a high frequency is applied to target 3. Sputtering is preferably effected using an applied high frequency power of 0.4 W/cm$^2$ or less at a film forming speed of 0.05 Å/sec–0.15 Å/sec. Substrate 2 is cooled with water to room temperature such as 20° −25° C. The pressure in chamber 1 is more preferably 0.1 −1 Torr, and the applied high frequency power is more preferably 0.2–0.4 W/cm$^2$. Thickness of the transparent electroconductive film is preferably 200–1000 Å.

As a substrate on which the p-type transparent electroconductive film is laminated, there may be used a glass plate, a plastic plate such as acrylic resin plate, polyester resin plate, vinyl resin plate, polyethylene resin plate, and the like, and ceramic plates and the like.

It is possible to improve the characteristics of the p-type transparent electroconductive film by adding a dopant to iridium or iridium oxide.

Various characteristics of the p-type transparent electroconductive film thus formed are measured.

Figure 2:
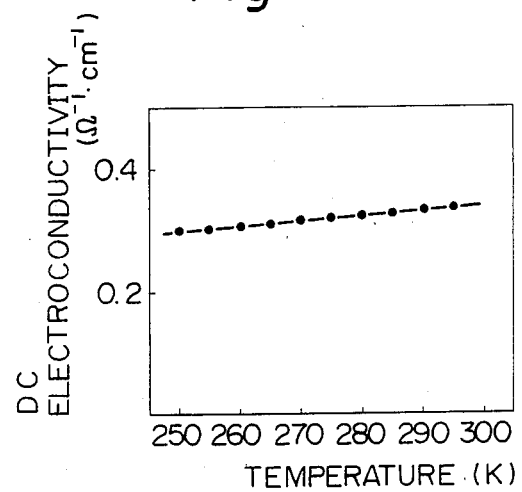
FIG. 2 is a graph showing the relation between temperature and electroconductivity of a p-type transparent electroconductive film of the present invention.

The relation of temperature and DC electroconductivity of the p-type transparent electroconductive film is measured and the results are shown in FIG. 2.

As is clear from FIG. 2, the p-type transparent electroconductive film of the present invention shows little dependency of electroconductivity on temperature and exhibits a metal-like behavior.

Specific resistance and light transmittance of the p-type transparent electroconductive film with respect to a varied high frequency power are measured. The results are shown in FIG. 3.

Figure 3:
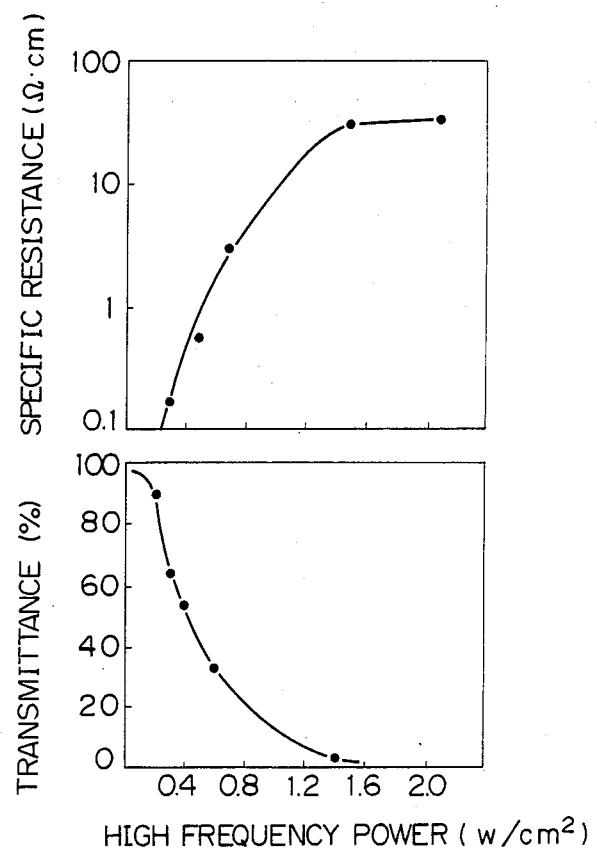
FIG. 3 is graphs showing the relation of high frequency power applied upon producion with specific resistance and light transmittance of a p-type transparent electroconductive film.

As shown in FIG. 3, the p-type transparent electroconductive film exhibits a light transmittance of 95% or higher and a specific resistance of 0.01 $\Omega$.cm or less when produced using a high frequency power of 0.2 W/cm$^2$.

Figure 4:
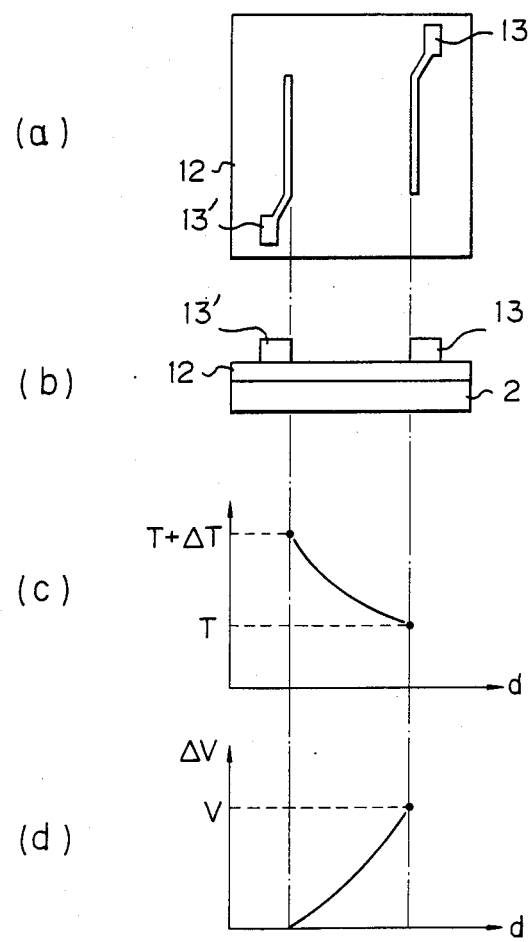
FIG. 4 (a)–(d) shows a principle of measuring a thermal electromotive force for determining pn of the transparent electroconductive film of the present invention.

Judging whether the iridium oxide film is of p-type or n-type is effected by a thermal electromotive force measurement. FIG. 4 shows the principle of the measurement. FIG. 4 (a) is a plan view of the sample to be measured, FIG. 4 (b) is a side view thereof. Gold electrodes (Au electrodes) 13, 13' are vapor-deposited on an iridium oxide thin film 12 on a glass substrate 2 and a temperature difference $\Delta T$, is produced between the electrodes 13 and 13' as illustrated in FIG. 4 (c). When the thin film 12 is of p-type, the charge transport carrier is a hole so that the hole is diffused from the high temperature side to the low temperature side and there is generated a potential gradient as shown in FIG. 4 (d). The result of the actual measurement is such as mentioned above. Thus, the iridium oxide film is found to be of p-type.

Figure 5:
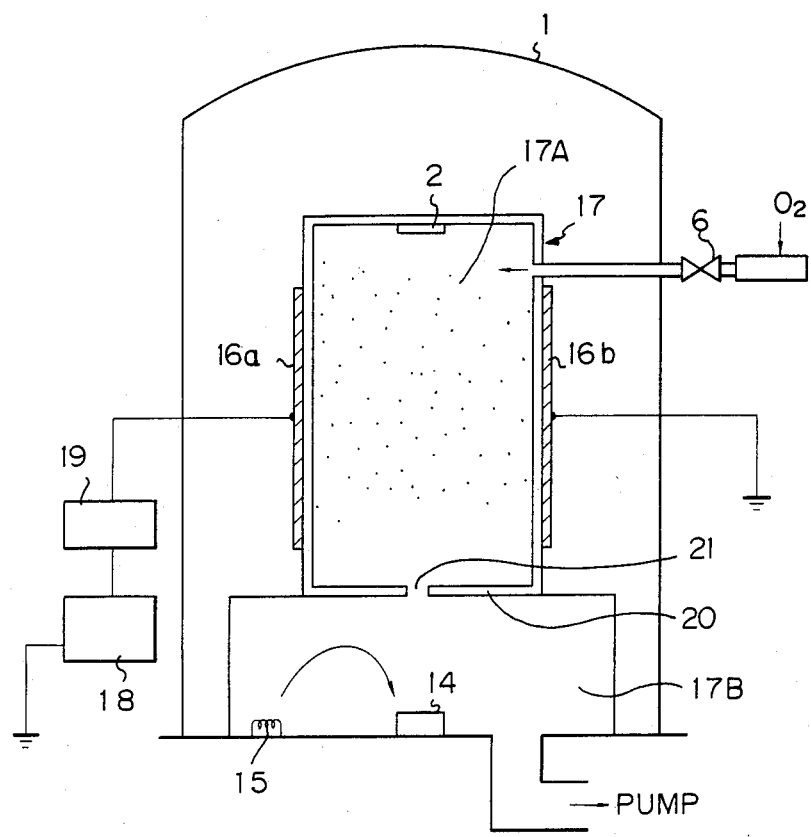
FIG. 5 shows schematically a reactive ion plating apparatus which may be used for producing a p-type transparent electroconductive film according to the present invention.

FIG. 5 shows a schematical cross sectional view of an apparatus for conducting a reactive ion plating method as another method for producing a p-type transparent electroconductive iridium oxide thin film of low resistance. In FIG. 5, 1 is a vacuum chamber, 2 a glass substrate on the surface of which a transparent electroconductive thin film of iridium oxide is to be formed, 6 a variable leak valve for introducing O$_2$ gas and controlling the inner pressure, 14 an evaporation source composed of metallic iridium, 15 an electron beam filament applying an electron beam to evaporation source 14, 16a, 16b electrodes for activating the reaction gas, 17 an inside bell jar (The bell jar is separated to two chambers 17A and 17B with a partition plate 20 which has a through-hole 21. The pressure in chamber 17A is higher than that in chamber 17B due to the through-hole 21.), 18 a high frequency power source for applying a high frequency power across the electrodes, and 19 a matching box for the high frequency power source.

In this apparatus, a glow discharge is used for activating gas, but a reactive ion plating may be effected by arc discharge. The temperature may be room temperature such as 20°–25° C.

In the above, the explanations are made referring to metallic iridium, but iridium oxide may be used as a target to produce a p-type transparent electroconductive film. In this case, it is preferable that the atmosphere gas is O$_2$ gas of about $2 \times 10^{-4}$ Torr. and the deposition speed is 1 Å/sec or less, and the substrate is cooled to about 20°–25° C.

The p-type transparent electroconductive film can be used, for example, for electrodes of solar cells and pick-up devices, and in addition, can be used as electrodes which simultaneously act as color forming layers of electrochromic elements.

In the following, the present invention will be explained further referring to the example.

EXAMPLE

On a p-type substance was formed the p-type transparent electroconductive film of the present invention as an electrode. As the p-type substance, NiO thin film was used. The NiO thin film was formed on a glass substrate. The electrode composed of the transparent electroconductive film was produced by a reactive sputtering using the apparatus of FIG. 1. The high frequency power was 0.4 W/cm$^2$. Into vacuum chamber 1 was introduced O$_2$ gas as a reaction gas and the pressure was kept at 0.40 Torr. The film forming speed was 0.1 Å/sec and the temperature of the glass substrate was 24° C. Thus, an iridium oxide thin film of 400 Å thick was formed on the NiO thin film.

It has been confirmed by measuring the electromotive force and the hole mobility that the main carrier of charge transport is hole in the iridium oxide transparent electrode. The transmittance for He-Ne laser (633 nm) was 90% or more and DC electroconductivity was 300 S·cm$^{-1}$.

Then, the ohmic characteristic of an electrode made of the transparent electroconductive film of the present invention was measured.

Figure 6:
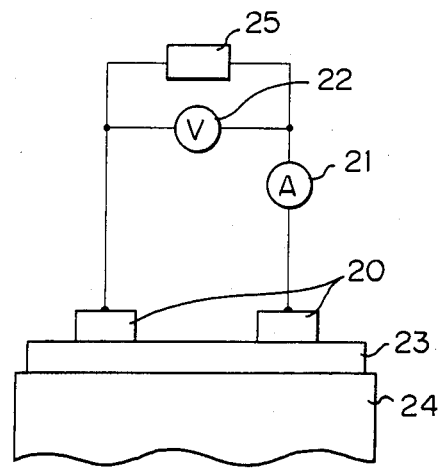
FIG. 6 shows schematically an example of a circuit for measuring ohmic characteristic of a thin film.

FIG. 6 schematically shows an example of a circuit for measuring ohmic characteristic of a thin film. Transparent electrodes 20 of the present invention are laminated on a NiO thin film 23 which is a p-type substance. NiO thin film 23 is formed on a glass substrate 24. 21 is an ammeter, 22 a voltmeter and 25 a voltage regulator. By using this circuit, the ohmic characteristic of the transparent electrode of the present invention was measured. The result is shown in FIG. 7.

Figure 7:
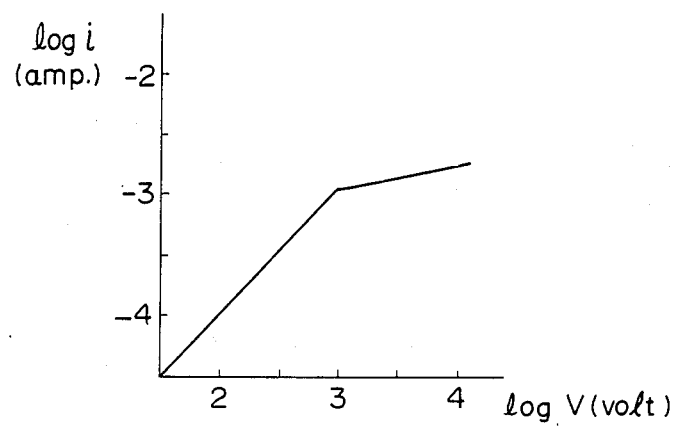
FIG. 7 is a graph showing ohmic characteristic of a transparent electroconductive film of the present invention.

As is clear from FIG. 7, the transparent electroconductive film has excellent characteristics as electrodes used for p-type substances.

What we claim is:

1. An electrode for use as a p-type semiconductor in a photoelectric transducer comprising a p-type transparent electroconductive iridium oxide film formed on a substrate by reactive sputtering in oxygen gas using metallic iridium or iridium oxide as a target.

2. An electrode according to claim 1, wherein the iridium oxide film is 200 to 1,000 angstroms thick.

3. An electrode according to claim 1, wherein the substrate is a plastic plate.

4. An electrode according to claim 3, wherein the plastic plate is selected from the group consisting of acrylic resin plate, polyester resin plate, polyethylene resin plate and vinyl resin plate.

5. An electrode according to claim 1, wherein the reactive sputtering is effected in a vacuum chamber at a pressure of 0.01–1 Torr.

6. An electrode according to claim 5, wherein the pressure is 0.1–1 Torr.

7. An electrode according to claim 1, wherein the reactive sputtering is effected by an applied high frequency power of 0.4 W/cm$^2$ or less.

8. An electrode according to claim 7, wherein the applied high frequency power is 0.2–0.4 W/cm$^2$.

9. An electrode according to claim 1, wherein the reactive sputtering is effected at a film forming speed of 0.05–0.15 angstroms/second.

10. An electrode according to claim 1, wherein the iridium oxide film has a transmittance to He-Ne laser light (633 nm) of 90% or more.

11. An electrode according to claim 1, wherein the iridium oxide film has a specific resistance of 0.01 ohm-centimeters or less.

12. An electrode according to claim 1, wherein the photoelectric transducer is a solar cell.

13. An electrode for use as a p-type semiconductor of a photoelectric transducer comprising a p-type transparent electroconductive iridium oxide film on a substrate formed by a reactive ion plating in oxygen gas using metallic iridium or iridium oxide as an evaporation source.

14. An electrode according to claim 13, wherein the reactive ion plating is effected at a film speed of 1 angstrom/second or less.

15. An electrode according to claim 13, wherein the photoelectric transducer is a solar cell.

* * * * *

UNITED STATES PATENT AND TRADEMARK OFFICE
CERTIFICATE OF CORRECTION

PATENT NO.   :   4,670,334
DATED        :   June 2, 1987
INVENTOR(S)  :   RYOJI FUJIWARA, ET AL.

It is certified that error appears in the above-identified patent and that said Letters Patent is hereby corrected as shown below:

AT [56] UNDER OTHER PUBLICATIONS

Line 1,   "Electro Chemical" should read --Electrochemical--.

COLUMN 2

Line 1,    "DRAWING" should read --DRAWINGS--.
    Line 10,   "is" should read --are--.

COLUMN 3

Line 33,   "cross sectional" should read --cross-sectional--.
    Line 46,   "to" should read --into--.

Signed and Sealed this

Tenth Day of November, 1987

Attest:

DONALD J. QUIGG

Attesting Officer      Commissioner of Patents and Trademarks